(12) United States Patent
Hill et al.

(10) Patent No.: US 8,009,420 B1
(45) Date of Patent: Aug. 30, 2011

(54) HEAT TRANSFER OF PROCESSING SYSTEMS

(75) Inventors: Robert J. Hill, Cupertino, CA (US); Gary L. Heinz, San Carlos, CA (US); Dwayne D. Komush, Livermore, CA (US); Bryan J. Chen, Santa Barbara, CA (US); James D. Phillips, Palo Alto, CA (US); Eric P. Wentzel, Portola Valley, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 66 days.

(21) Appl. No.: 12/571,282

(22) Filed: Sep. 30, 2009

Related U.S. Application Data

(60) Provisional application No. 61/101,556, filed on Sep. 30, 2008.

(51) Int. Cl.
*G06F 1/20* (2006.01)
*H05K 7/20* (2006.01)

(52) U.S. Cl. ............... 361/679.54; 361/704; 361/707; 361/719; 361/720; 257/686

(58) Field of Classification Search ........... 361/679.46, 361/679.54, 690, 704, 707, 715–716, 719, 361/721, 720; 165/80.2–80.3, 185; 257/686
See application file for complete search history.

(56) References Cited

U.S. PATENT DOCUMENTS

| | | | | |
|---|---|---|---|---|
| 3,550,681 A * | 12/1970 | Scaboo et al. | ............... | 165/80.3 |
| 4,849,858 A * | 7/1989 | Grapes et al. | ................. | 361/708 |
| 4,963,414 A * | 10/1990 | LeVasseur et al. | ......... | 428/195.1 |
| 5,086,333 A * | 2/1992 | Osada et al. | .................. | 257/677 |
| 5,195,021 A * | 3/1993 | Ozmat et al. | .................. | 361/720 |
| 5,319,521 A * | 6/1994 | Adkins | ......................... | 361/707 |
| 5,424,916 A * | 6/1995 | Martin | ......................... | 361/698 |
| 5,455,738 A * | 10/1995 | Montesano et al. | .......... | 361/707 |
| 6,810,944 B2 * | 11/2004 | Wiacek et al. | .................. | 165/41 |
| 2008/0036065 A1* | 2/2008 | Brunnbauer et al. | ......... | 257/686 |
| 2009/0127686 A1* | 5/2009 | Yang et al. | .................... | 257/686 |

* cited by examiner

*Primary Examiner* — Robert J Hoffberg
(74) *Attorney, Agent, or Firm* — McDermott Will & Emery LLP

(57) ABSTRACT

A processing module may be provided. The processing module may include a mounting member configured to structurally support a first processing unit and receive thermal energy from the first processing unit through a coupling side of the first processing unit by conduction. The processing module may also include a base member coupled to the mounting member. The base member may be configured to receive thermal energy from the mounting member. A thermal conductivity of at least one of the mounting member and the base member may be greater than about 50 Watts/meter Celsius (W/m-C). Coefficients of thermal expansion (CTEs) of the mounting member, the base member, and the coupling side of the first processing unit may be matched.

19 Claims, 10 Drawing Sheets

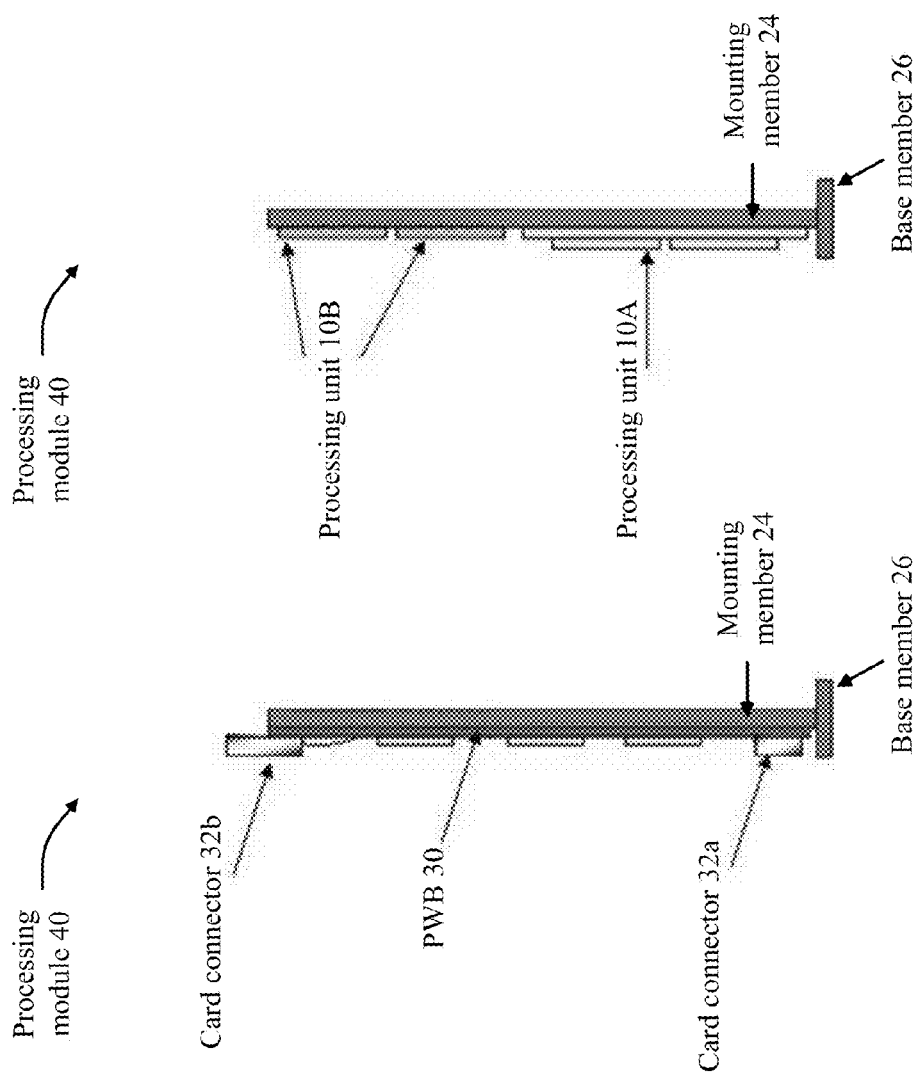

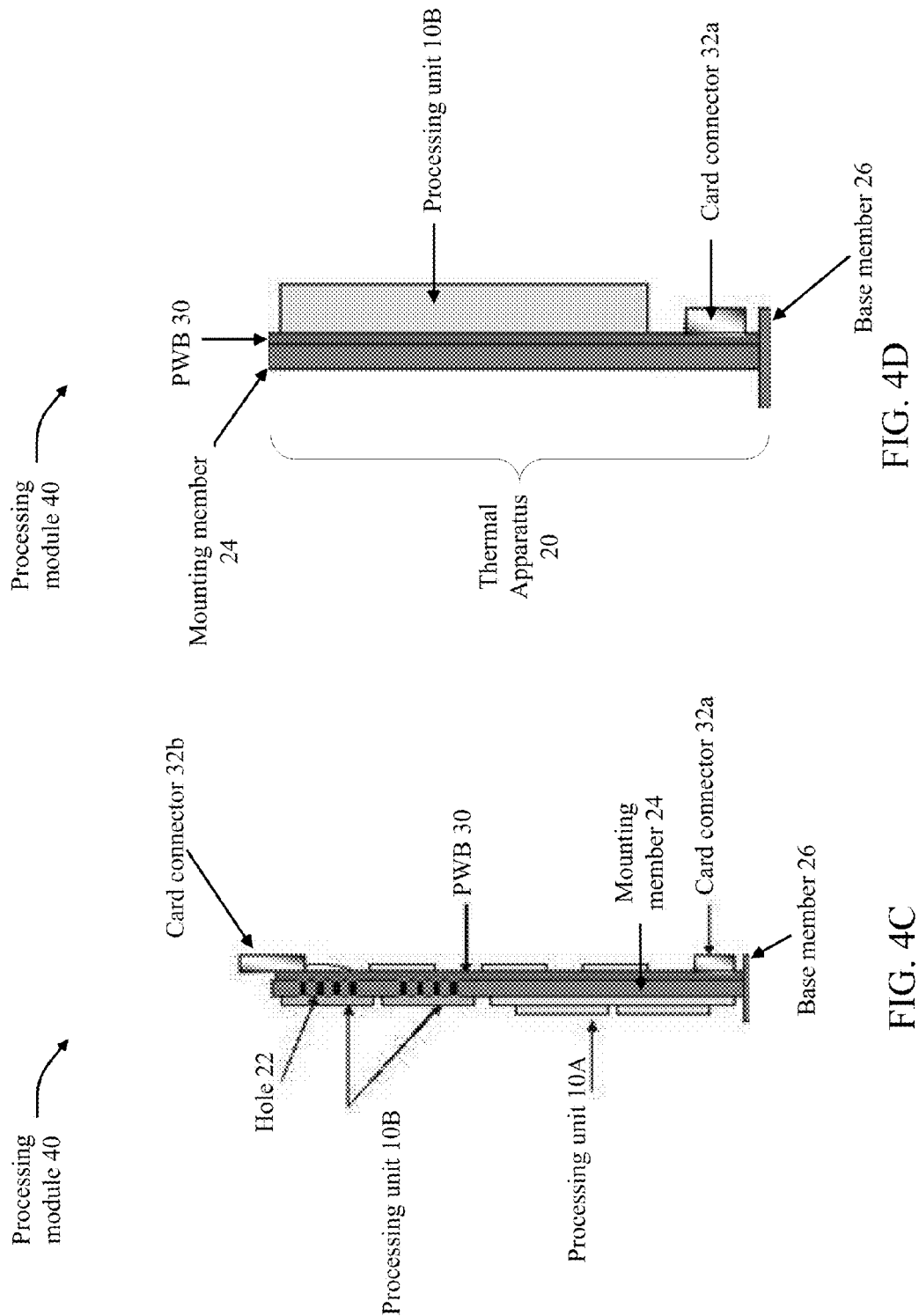

HEAT TRANSFER OF PROCESSING SYSTEMS

CROSS-REFERENCES TO RELATED APPLICATIONS

The present application claims the benefit of U.S. Provisional Patent Application Ser. No. 61/101,556, entitled "HIGH THROUGHPUT PAYLOAD ELECTRONIC BOXES FOR SPACE APPLICATIONS," filed on Sep. 30, 2008, which is hereby incorporated by reference in its entirety for all purposes.

STATEMENT AS TO RIGHTS TO INVENTIONS MADE UNDER FEDERALLY SPONSORED RESEARCH OR DEVELOPMENT

Not Applicable.

FIELD

The present invention generally relates to processing systems and, in particular, relates to heat transfer of processing systems.

BACKGROUND

Heat transfer may occur when thermal energy from a hot object transitions to a cooler object. When an object or fluid is at a different temperature than its surroundings or another object, transfer of thermal energy, which may be referred to as heat transfer, or heat exchange, can occur in such a way that the body and the surroundings reach thermal equilibrium. Heat transfer may be described by the second law of thermodynamics and may be relevant to electronics, where components may generate heat, and the performance of the components may be affected by the temperature increase due to heat.

SUMMARY

According to various aspects of the subject disclosure, the subject technology provides for effective heat dissipation of processing units, for example those electronics found in electronic boxes, in addition to an efficient arrangement and packaging of those processing units. With effective heat dissipation, improved processing power can be achieved. In some aspects, module, card and box architectures may be provided for efficiently carrying heat. A box may comprise one or more processing modules. A processing module may comprise one or more processing units, printed wiring boards (PWBs), and thermal apparatuses. A processing unit may comprise processing chips and power converters. In some aspects, an approach for removing heat from processing electronics may integrate the following technologies: advanced packaging of processing chips, thermal apparatus to remove heat from processing units, heat spreaders and next generation heat pipes to remove heat from processing modules secured within boxes.

According to one aspect of the subject disclosure, a processing module may be provided. The processing module may comprise a mounting member configured to structurally support a first processing unit and receive thermal energy from the first processing unit through a coupling side of the first processing unit by conduction. The processing module may also comprise a base member coupled to the mounting member. The base member may be configured to receive thermal energy from the mounting member. A thermal conductivity of at least one of the mounting member and the base member may be greater than about 50 Watts/meter Celsius (W/m-C). Coefficients of thermal expansion (CTEs) of the mounting member, the base member, and the coupling side of the first processing unit may be matched.

According to another aspect of the subject disclosure, a processing unit may be provided. The processing unit may comprise a substrate comprising a proximal side and a distal side. The proximal side may be coated with a coating having a thermal conductivity greater than about 300 W/m-C. The processing unit may comprise a first chip comprising a proximal side and a distal side. The proximal side of the first chip may be coupled to the distal side of the substrate using a first connector. The first connector may be configured to provide at least one of an electrical connection and a thermal conduit between the substrate and the first chip. The first connector may be positioned substantially in an inner portion of the first chip. The processing unit may also comprise a second chip comprising a proximal side and a distal side. The proximal side of the second chip may be coupled to the distal side of the first chip using a second connector. The second connector may be configured to provide at least one of an electrical connection and a thermal conduit between the first chip and the second chip. The second connector may be positioned substantially in an inner portion of the second chip. CTEs of the substrate, the first chip, and the second chip may be matched.

According to yet another aspect of the subject disclosure, a processing system may be provided. The processing system may comprise a base panel and a processing module. The processing module may be coupled to the base panel. The processing module may comprise a mounting member configured to structurally support a first processing unit and receive thermal energy from the first processing unit through a coupling side of the first processing unit by conduction. The processing module may also comprise a base member coupled to the mounting member and the base panel. The base member may be configured to receive thermal energy from the mounting member. A thermal conductivity of at least one of the mounting member and the base member may be greater than about 50 W/m-C. The base panel may be configured to receive thermal energy from the base member. CTEs of the coupling side of the first processing unit, the mounting member, the base member, and the base panel are matched.

Additional features and advantages of the invention will be set forth in the description below, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide further understanding of the invention and are incorporated in and constitute a part of this specification, illustrate aspects of the invention and together with the description serve to explain the principles of the invention.

FIGS. 3A, 3B, 4A, 4B, 4C and 4D illustrate examples of processing modules, in accordance with various aspects of the subject disclosure.

DETAILED DESCRIPTION

Figure 1A:
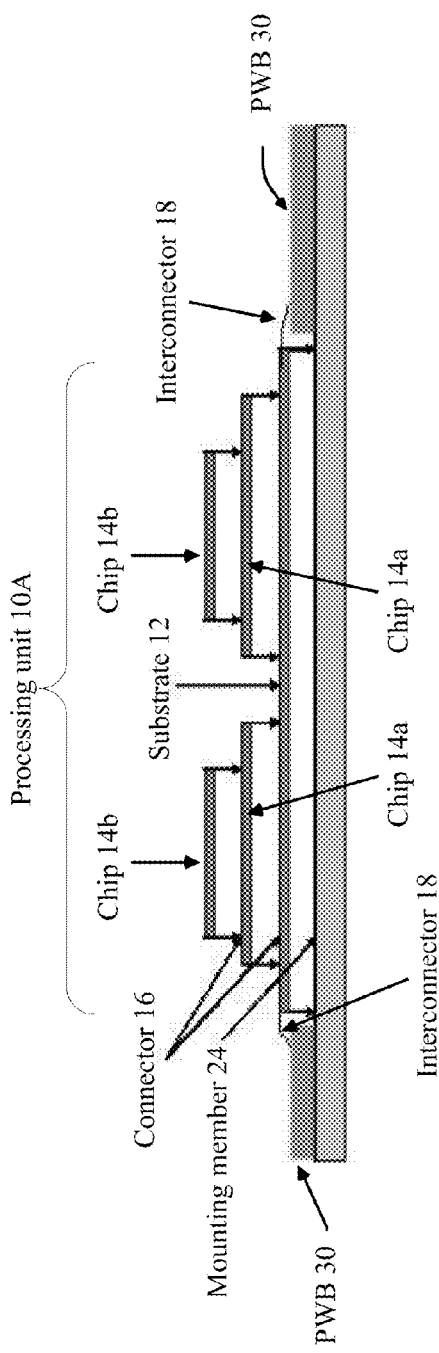
FIGS. 1A and 1B illustrate examples of a processing unit, in accordance with various aspects of the subject disclosure.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology.

Space electronics, for example those electronics found in electronic boxes, may be limited in their ability to reject the heat generated by processing units, such as processing chips and power supplies. Conductive heat rejection may be limited by the thermal impedance of chip packaging materials and technologies, the distance from power dissipating chips to heat pipes, the conducting properties of printed wiring boards (PWBs) and the heat carrying capacity of heat pipes. One approach to compensating for these limits involves adding heavy thermal bridges, moving the backplane to the side of the box and employing difficult to inspect flip chip technology. Architectural strategies may also be used, such as dispersing hot cards among cooler cards or simply designing processing cards with fewer heat generating application-specific integrated circuits (ASICs) or field-programmable gate arrays (FPGAs). Designers of such electronic boxes may employ these approaches, but undesirable side effects, such as increased size, weight and power (SWAP), increased cost, reduced reliability or reduced system performance may still occur. Without a new approach, current technology may approach a barrier to Moore's Law throughput improvements due to the inability to reject heat.

According to various aspects of the subject disclosure, the subject technology provides for effective heat dissipation of processing units, for example those electronics found in boxes, in addition to an efficient arrangement and packaging of those processing units. With effective heat dissipation, improved processing power can be achieved. Further processing improvements are provided that significantly benefit signal intelligence (Sigint), image intelligence (Imint), hyperspectral, communications and ladar payloads. In some aspects, a unique approach for integrating technologies is provided. These technologies may be useful for returning to Moore's Law processing throughput and, in some cases, have already achieved space flight status. A means to take maximum advantage of their heat carrying capacities is described. In some aspects, a blue print for how to optimally manufacture, assemble and test resulting hardware in a way that reduces cost and cycle time is provided.

The inherent flexibilities of various aspects of the subject disclosure enable box designers to tailor or adapt the disclosed approach to best accommodate the unique requirements of future systems. Robust processing improvements enabled by this approach may allow customers and system architects to think differently about which functions are accomplished in space and which can be accomplished on the ground. The improvements may allow innovators to rethink the mathematical algorithms acting on raw sensor data and to improve the quality and quantity of the data provided to users. If desired, the improved processing power may be used to reduce the cost of expensive and heavy communications channels to the ground by performing more processing onboard. In some aspects, the disclosed technologies may enable system designers to avoid expensive ground processing by moving it to space, which has the benefit of forcing cost reducing simplifications.

According to various aspects of the subject disclosure, module, card and box architectures may be provided for efficiently carrying heat. In some aspects, a box may comprise one or more processing modules. A processing module may comprise one or more processing units, PWBs, and thermal apparatuses. A processing unit may comprise processing chips and power converters. In some aspects, an approach for removing heat from processing electronics may integrate the following technologies: advanced packaging of processing chips (e.g., silicon-on-silicon packaging of processing chips), thermal apparatus (e.g., carbon-carbon structures) to remove heat from processing units, heat spreaders and next generation heat pipes to remove heat from processing modules secured within boxes. In one example, carbon-carbon may be a composite material comprising carbon fiber reinforcement in a matrix of graphite. In some aspects, carbon-carbon may be referred to as carbon fiber-reinforced carbon.

Figure 1B:
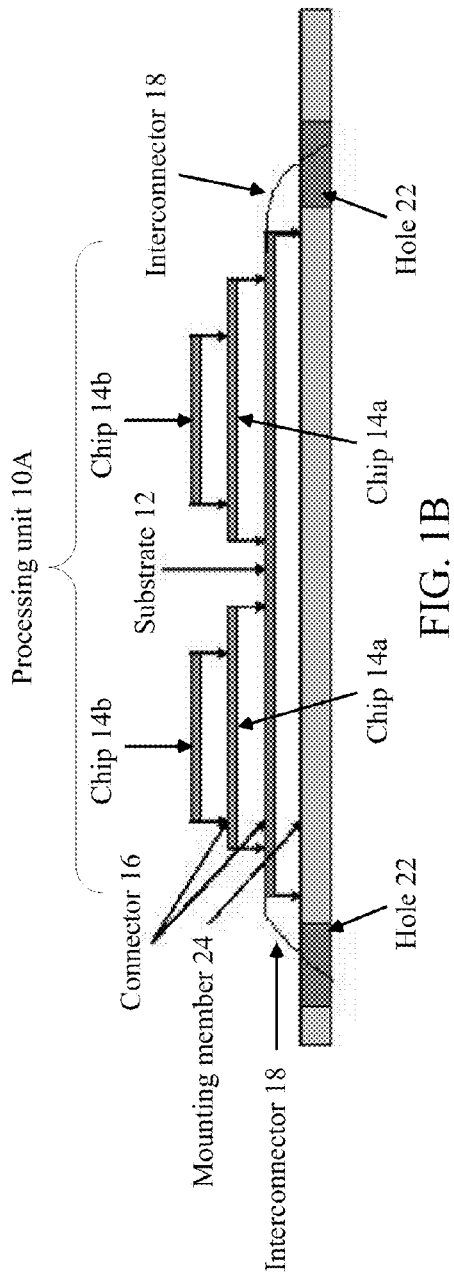

FIGS. 1A and 1B illustrate examples of processing unit 10A, in accordance with various aspects of the subject disclosure. Processing unit 10A may be used for various processing, for example, on a spacecraft and may be contained in an electronic box. Processing unit 10A may comprise substrate 12, one or more chips 14 (e.g., chip 14a and 14b), and one or more connectors 16. Substrate 12 may comprise a proximal side (e.g., bottom side of substrate 12 as shown in FIG. 1A) and a distal side (e.g., top side of substrate 12 as shown in FIG. 1A). Each chip 14 may comprise a proximal side (e.g., bottom side of chip 14 as shown in FIG. 1A) and a distal side (e.g., top side of chip 14 as shown in FIG. 1A).

In some aspects, substrate 12 may comprise at least one of silicon, gallium arsenide (GaAs), gallium sulfide (GaS), gallium phosphide (GaP), gallium nitride (GaN), alumina oxide, other compound III-V or II-VI type wafers, and other suitable materials known to those of skill in the art. In some aspects, substrate 12 may comprise an integrated silicon motherboard (ISIM). In one example, substrate 12 may comprise greater than about 90% silicon. In another example, substrate 12 may comprise greater than about 99.9999% silicon. Substrate 12 may provide high thermal conductivity, for example, equal to or greater than about 140 Watts/meter-Celsius (W/m-C). Substrate 12, for example, may be designed and fabricated using standard, space qualified complementary metal-oxide-semiconductor (CMOS) silicon processing technologies. In some aspects, substrate 12 may be used to implement circuit traces used to interconnect electronic components typically found on a processing card. Substrate 12 may be created by reticle stitching together individual patterns, created at the limit of stepper technology, into motherboards as large of 4.20×6.06 inches, for example. Other sizes of substrate 12, depending on the application, may be used. The reticle may be used to expose photomasks to ultraviolet (UV) light during normal CMOS processing. Shuttered vanes may be used to expose multiple patterns containing the desired lithography in a step and repeat fashion to create an integrated circuit much larger than the reticle dimensions.

In some aspects, processing unit 10A may integrate substrate 12 (e.g., silicon-on-silicon motherboards) with 3D stacks of chips 14. In some aspects, substrate 12 and chips 14 may be integrated vertically via one or more connectors 16. Designers of boxes (e.g., payload processing designers) may select high power consuming chips and position them together in a tightly packed module with extremely short electrical paths between them. A coefficient of thermal expansion (CTE) of substrate 12 and chips 14 may be matched (e.g., the CTE of each component being within about 80% to 99% of each other), and the distance between chips 14 may be exceptionally short, greatly reducing needed drive currents, and hence reducing power consumed. In one example, the CTE of bonded components (e.g., chips 14 and substrate 12) may be set to about 1, thus lowering cost and improving reliability.

Chips 14 may comprise silicon chips, digital application-specific integrated circuits (ASICs), field-programmable gate arrays (FPGAs), and memories. In some aspects, substrate 12 may comprise multiple metal and/or polysilicon layers. In some aspects, these layers may be used for resistors and capacitors (eliminating surface mounted components that may consume precious board real estate). In one example, substrate 12 may comprise up to seven metal layers. Substrate 12 may comprise a bare printed wiring board and one or more embedded passive components. The passive components may be embedded in the printed wiring board. In some aspects, the passive components comprise at least one of a resistor, a capacitor, and a diode. Substrate 12 may provide electronic connectivity among chips 14, and/or between chips 14 and off module electronics. In some aspects, chips 14 and substrate 12 may be made of the same material. In one example, chips 14 and substrate 12 comprise substantially of silicon (e.g., each of chips 14 and substrate 12 comprises at least about 90% silicon).

In accordance with various aspects of the subject disclosure, the proximal side of substrate 12 may be coated with at least one of carbon-carbon, diamond, copper, aluminum, and silicon to improve heat transfer to mounting member 24. In some aspects, a coating having a thermal conductivity greater than about 300 Watts/meter Celsius (W/m-C) may be applied to the proximal side of substrate 12. In one example, the thermal conductivity of the coating may be between about 300 to 1000 W/m-C. In some aspects, the coating may have a thermal conductivity greater than about 1000 W/m-C. In one aspect, it may be advantageous to use diamond as a coating (or a diamond-like coating) for substrate 12 because of, for example, its high thermal conductivity and its suitability as a coating on a silicon substrate. In one example, it may be advantageous to coat the proximal side of substrate 12 with diamond by vapor deposition. In one aspect, it may be advantageous to coat the proximal side of substrate 12 with carbon-carbon because of, for example, its high thermal conductivity and its suitability as a coating on a silicon substrate. In some aspects, the coating may cover at least about 80% of the total surface area of the proximal side of substrate 12. In another aspect, the coating may cover at least 90% of the total surface area of the proximal side of substrate 12.

Furthermore, the architecture of processing unit 10A may provide enhanced chip-to-chip (e.g., chip 14b to chip 14a) and board-to-board (e.g., processing unit 10A to PWB 30) communication. For example, connectors 16 may be used on either side of substrate 12 and chips 14. In one example, the proximal side of chip 14a may be coupled to the distal side of substrate 12 using one or more connectors 16. In another example, a connector 16 may be deposited on the distal side of substrate 12 to attach a bare electronic die. A connector 16 may also provide at least one of an electrical connection and a thermal conduit between substrate 12 and chip 14a, and/or between chip 14a and chip 14b. Connector 16 may be applied in any desired location and may number in the millions per processing unit 10A. For example, connector 16 may be positioned substantially in an inner portion of chip 14a, which may provide chip-to-chip communication in an inner portion of chip 14a rather than at the edges of chip 14a. As a result, chip-to-chip communication may originate in the middle of a chip rather than at the edges, enabling gateware designers to be more efficient in place and route. With experience, designers may be able to rethink the process of converting algorithms, for example, from concept to software such as MATLAB™ to simulation to VHDL to gateware, all with the objective of a more efficient layout to improve speed and reduce power.

The proximal side of chip 14b may be coupled to the distal side of chip 14a using another connector 16. Connector 16 may provide at least one of an electrical connection and a thermal conduit between chip 14a and chip 14b. Connector 16 may also be positioned substantially in an inner portion of chip 14b. Because of the reduced distance between chips 14 and substrate 12 (in addition to any other circuits embedded in substrate 12), the power and current needed to drive chip-to-chip and board-to-board interfaces may be reduced. This may result in increased electronics performance through improved signal integrity, higher communication speeds, and reduced consumed power. In some aspects, the 3D nature of the connection provided by connectors 16 may enable designers to rethink how math algorithms can be implemented in silicon, improving their speed and power efficiency. In one example, memories may be mounted directly to the ASICs or FGPAs, so long as designers have this system concept in mind when laying out the chip-to-chip communication paths.

In one example, the proximal side of chip 14b may comprise one or more circuits (e.g., circuits facing towards substrate 12) and the distal side of chip 14a may comprise one or more circuits (e.g., circuits facing away from substrate 12). In such a configuration, electrical signals may travel from chip 14a to chip 14b and vice versa via connector 16 that include, for instance, solder bumps. In some aspects, wire bonds may be used to connect the distal side of chip 14a to the distal side of substrate 12 for communicating electrical signals. In another example, the distal side of chip 14b and the distal side of chip 14a may comprise one or more circuits. In such a configuration, wire bonds may be used to connect the distal side of chip 14b to the distal side of chip 14a and to connect the distal side of chip 14a to the distal side of substrate 12 for communicating electrical signals.

In some aspects, connector 16 may comprise at least one of a bump bond, a thermal via, a screw, a copper flex braid, a thermally conductive bonding agent, a conductive epoxy, and adhesive. In some aspects, the conductive epoxy may comprise diamond filled epoxy. In some aspects, the bump bond may comprise an indium bump bond. In some aspects, connection between processing unit 10A and other circuits or boards (e.g., PWB 30) may be provided by interconnector 18. Interconnector 18 may comprise wire bonds or other suitable connectors between and among boards and chips known to those of skill in the art. As shown in FIG. 1A, PWB 30 may also be mounted onto mounting member 24, and one or more interconnectors 18 may be used to connect processing unit 10A to PWB 30. As shown in FIG. 1B, mounting member 24 may comprise one or more holes 22 such that interconnectors 18 may be used to connect processing unit 10A, for example, with one or more other processing units, PWBs, or substrates mounted on the other side of mounting member 24.

According to certain aspects, CMOS fabrication techniques, chip technologies and connectors 16 may be space qualified. In one example, at least one of substrate 12, chip 14, and connectors 16 may be space qualified. In accordance with various aspects of the subject disclosure, module reliability may be improved in part because CTE mismatch issues can be eliminated by not using Ball Grid Arrays or Column Grid Arrays. Connectors 16, for example indium bumps, may be demonstrated to have high thermal and mechanical reliability, easily handling thermal stresses during thermal cycling for space applications, as well as mechanical stresses under large loads.

In some aspects, as with other multi-chip module approaches, manufacturing processing unit 10A may require careful testing before integration (e.g., mounting onto mounting member 24 and/or connecting processing unit 10A with other processing units), to avoid the cost of having to scrap an expensive integrated module with multiple chips 14 and the cost of significant manufacturing and test labor. After processing unit 10A is manufactured, it can be tested via automated testers to ensure that it meets rigid performance specifications. After confirming that each component has met specifications, substrate 12 may be coated, such as being diamond coated by vapor deposition. Chips 14 may then be bonded to substrate 12 using connectors 16, for example indium bump bonded to substrate 12. In one example, if memories are included in the 3D stack (e.g., chip 14b), these may be connected to the distal side of processing chips (e.g., chip 14a) using connectors 16. To reduce the risk of continuing manufacturing with failures induced either by handling or the bonding process, the completed processing unit 10A may be tested using test pads on the substrate 12. The manufactured, assembled and tested processing unit 10A may then be connected to mounting member 24, for example, through direct bonding.

Figure 2A:
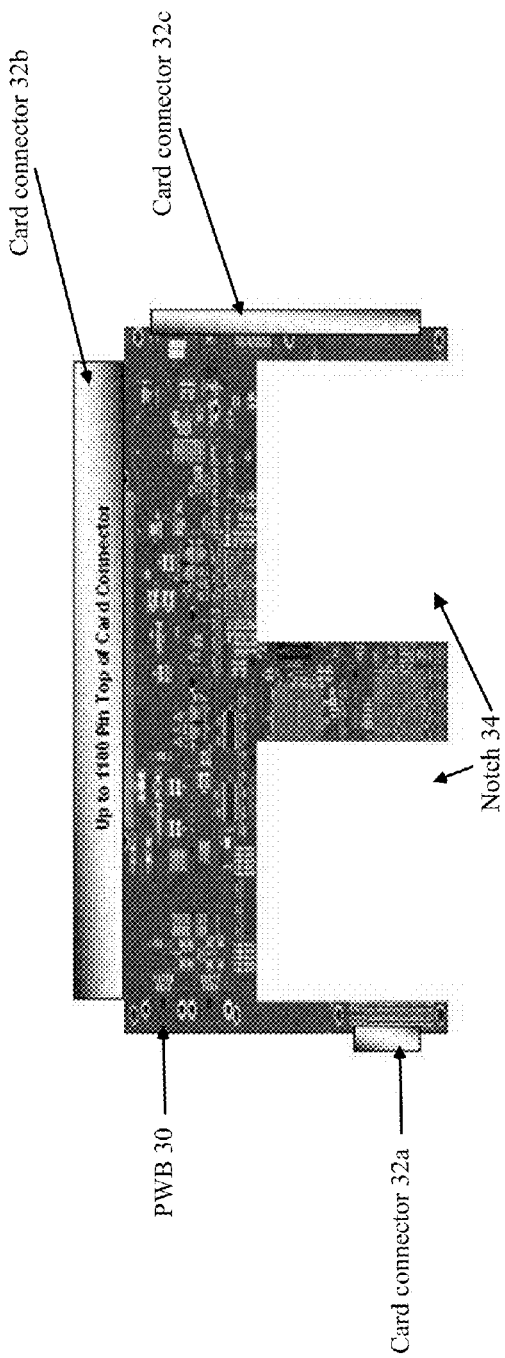
FIGS. 2A and 2B illustrate examples of printed wiring boards, in accordance with various aspects of the subject disclosure.
Figure 2B:
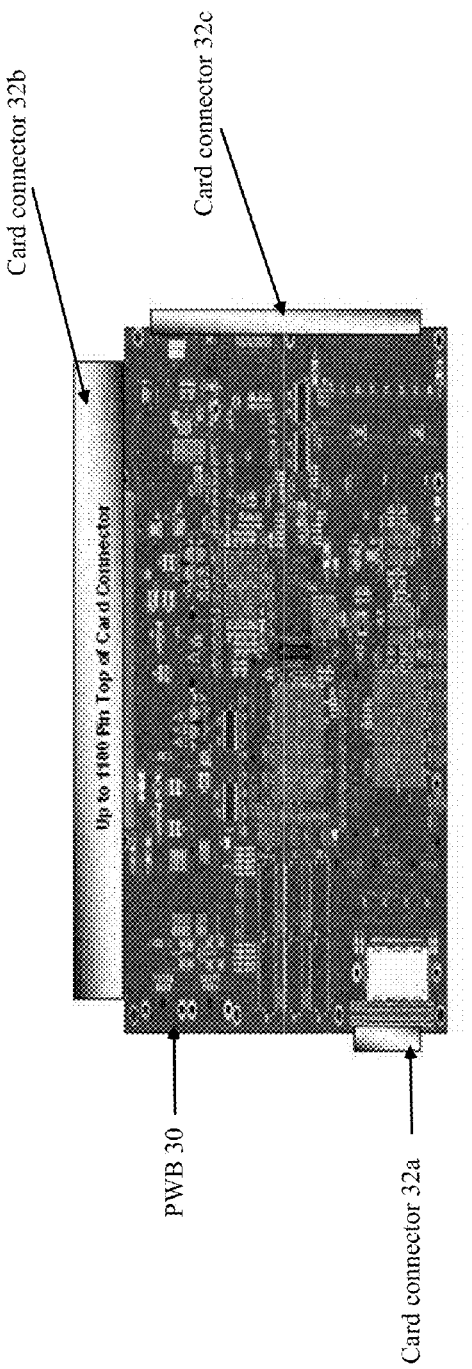

FIGS. 2A and 2B illustrate examples of PWBs 30, in accordance with various aspects of the subject disclosure. PWBs 30 may comprise traditional polyimide cards used for electrical functions not consuming large amounts of power. PWBs 30 may comprise one or more card connectors 32 (e.g., card connectors 32a, 32b, 32c) for connecting PWB 30 to another circuit or card. In some aspects, card connectors 32 may comprise power connectors (e.g., card connector 32a), which may be located on any side of PWB 30, so that PWB 30 may receive power. For example, card connector 32a may comprise a 5 volt direct current (DC) power connector. Card connectors 32 may also comprise backplane connectors (e.g., card connectors 32c) and top of card connectors (e.g., card connectors 32b). In some aspects, card connectors 32 may be placed on any side of PWB 30. In some aspects, card connectors 32 may be placed on any side of PWB 30 except the bottom surface of PWB 30, as shown in FIGS. 2A and 2B. In some aspects, card connectors 32b may be integrated with ribbon cables to connect various processing cards together, similar to connections internal to a personal computer. This approach may enable easy card removal during debugging, assembly, and/or testing.

In some aspects, card connectors 32 may comprise very high density metric (VHDM) connectors. These connectors, for example, may be designed by the company, TERADYNE™, and manufactured by the companies, MOLEX™ and AMPHENOL™. VHDM connectors may be scalable. VHDM connectors may be designed for applications that use high interconnect density and high speed signal integrity. VHDM connectors may be available in both 6 row and 8 row configurations with ground planes between columns. In some aspects, the grid of the mating face may be 2 mm between columns and 2.25 mm between rows. The ground planes may be interstitial to the signal grid. Standard VHDM connectors may support data rates of about 2.5 Gb/s with less than about 5% crosstalk.

In some aspects, card connectors 32, for example daughter card connectors, may be made from wafers, where each wafer may have a column of signal contacts plus a ground plane. The wafers may then be mounted onto a stiffener to make a monoblock connector. This connector can include signal wafers, guide blocks, and power modules. On a backplane side (e.g., on the side of card connector 32c as shown in FIGS. 2A and 2B), headers may be available in lengths of 10 and 25 columns. Open and guide pin versions may be provided. Extremely robust free standing guide pins may also be provided, which may be mounted directly into the backplane of PWB 30 and can accommodate heavier daughter cards.

In some aspects, PWBs 30 may be integrated and assembled with other processing units (e.g., processing unit 10A of FIGS. 1A and 1B) and thermal apparatus (e.g., mounting member 24), providing relatively dense card-to-card spacing and greatly improved heat carrying capacity. For example, PWBs 30 and processing unit 10A may both be mounted onto mounting member 24. PWBs 30 may comprise one or more notches 34 (e.g., cutout regions) so that one or more processing units 10A may be fitted within notches 34 while PWBs 30 and processing units 10A are mounted to mounting member 24. PWBs 30 may be connected to processing unit 10A using one or more interconnectors 18. Interconnectors 18 may comprise wire bonds. In some aspects, PWBs 30 may comprise pads (not shown) for wire bonds from processing unit 10A. In some aspects, these pads may be located on the front of PWBs 30 along notches 34. In some aspects, if more PWB space is needed, another PWB may be placed and/or bonded to a back side of mounting member 24, and connected by flex cable to the front PWB.

FIGS. 3A, 3B, 4A, 4B, 4C and 4D illustrate examples of processing module 40, according to various aspects of the subject disclosure. Processing module 40 may comprise thermal apparatus 20, processing unit 10 (e.g., either processing unit 10A and/or 10B), PWB 30, and interconnectors 18. Processing unit 10A, for example and discussed above, may comprise one or more chips 14 (e.g., chip 14a and 14b). Processing unit 10B may comprise other processing units such as power converters. Thermal apparatus 20 may comprise mounting member 24 and base member 26.

Figure 3A:
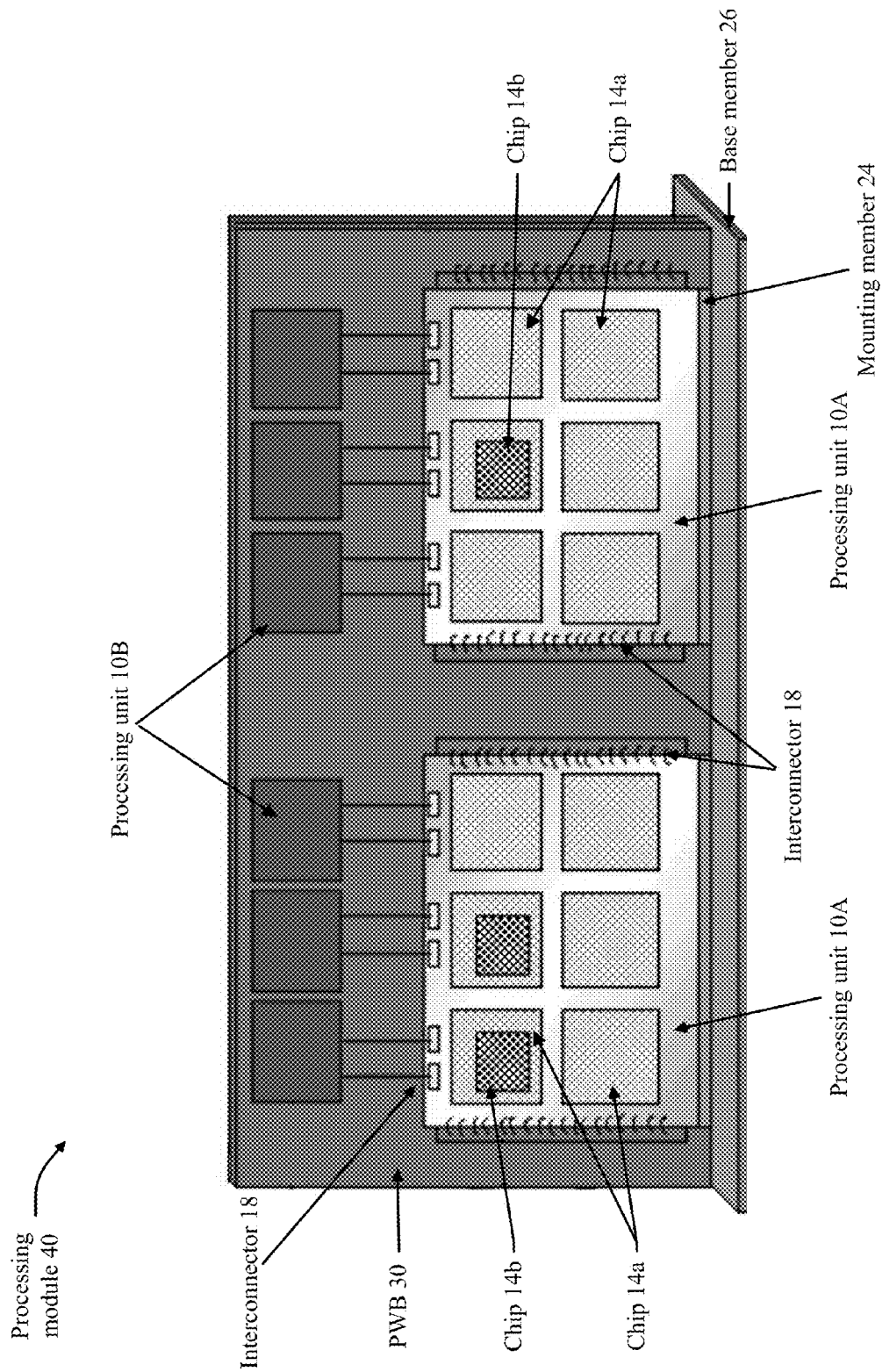

In some aspects, thermal apparatus 20 may provide structural strength and heat removal for processing units 10, transporting and spreading the heat. For example, mounting member 24 may structurally support processing unit 10 and receive thermal energy from processing unit 10 through a coupling side of processing unit 10 by conduction. In some aspects, the coupling side of processing unit 10 may be the side on which processing unit 10 is coupled to mounting member 24 (e.g., proximal side of substrate 12 for processing unit 10A). Base member 26 may be coupled to mounting member 24 and receive thermal energy from mounting member 24. In some aspects, heat sinks are not used in removing heat from processing unit 10. For example, heat sinks are not placed on the non-coupling side of processing unit 10. Mounting member 24 may also structurally support PWB 30, with PWB 30 coupled to processing units 10 using one or more interconnectors 18. For example, PWB 30 may be integrated electrically to processing units 10A by wire bonding processing units 10A to pads on PWB 30 (e.g., as shown in FIG. 3A). In some aspects, PWB 30 may comprise further circuitry needed for a fully functional processing module 40 and point of load (POL) power converters (e.g., processing units 10B).

In some aspects, mounting member 24 may comprise a first side and a second side, for example as shown in FIG. 4C. Each side may be coupled to processing units 10 and may receive thermal energy from the processing units 10 and/or PWBs 30 on either side by conduction. Mounting member 24 may comprise one or more holes 22 so that connections can be made between processing units 10 and/or PWBs 30 on either side of mounting member 24.

In some aspects, thermal apparatus 20 may be referred to as a Thermalblade. Mounting member 24 and base member 26 may be integrally formed to provide thermal apparatus 20. Base member 26 may be orthogonally coupled to mounting member 24 to form a T-shaped card (e.g., as viewed from the side as shown in FIGS. 4A, 4B, 4C and 4D) that provides structural integrity and directional heat carrying capacity that may vary by axis. At least one of mounting member 24 and base member 26 may comprise at least one of carbon-carbon, diamond, copper, aluminum, silicon and other suitable materials with high thermal conductivity, and optionally with high stiffness and/or a low coefficient of thermal expansion (CTE) that may substantially match with the CTE of chips 14a, 14b. In one example, it may be advantageous for mounting member 24 and/or base member 26 to comprise carbon-carbon and/or diamond because of the high thermal conductivity, rigidity, and low CTE of carbon-carbon and diamond. In one example, the entire mounting member 24 and/or base member 26 (e.g., greater than 90% of member 24 and/or base member 26) comprise carbon-carbon and/or diamond.

In some aspects, mounting member 24 and/or base member 26 may comprise multiple layers of the same or different coating materials (e.g., carbon-carbon, diamond, copper, aluminum, silicon and other suitable materials with high thermal conductivity, high stiffness, and/or a low CTE). These multiple layers may include one or more outer layers and one or more inner layers. In one example, mounting member 24 may have one or more outer layers (e.g., an outer surface where processing unit 10A and processing unit 10B are mounted to, or an outer surface where PWB 30 is mounted to, as shown in FIG. 4C) and one or more inner layers. In one example, an outer layer may cover an entire flat surface of mounting member 24, and substantially the entire outer layer (e.g., greater than 80% or 90% of the outer layer) of mounting member 24 may be coated with carbon-carbon and/or diamond.

In some aspects, the thermal conductivity of at least one of mounting member 24 and base member 26 may be greater than about 50 W/m-C. For example, the thermal conductivity of thermal apparatus 20 may be 350 W/m-C in vertical and/or horizontal directions (e.g., as viewed from the side as shown in FIGS. 4A, 4B, 4C and 4D). This may be particularly useful for heat spreading. In some aspects, thermal apparatus 20 may be extremely rigid. For example, a Young's modulus of at least one of mounting member 24 and base member 26 may be greater than about 30 Giga-Pascal (GPa). In some aspects, the Young's modulus of at least one of mounting member 24 and base member 26 may be greater than about 75 GPa. In one example, the Young's modulus of thermal apparatus 20 may be about 300 GPa, which may be about four times as stiff as aluminum.

In some aspects, a CTE of thermal apparatus 20 and processing units 10 may be matched. For example, a CTE of mounting member 24, base member 26, chips 14, substrate 12, a coating of substrate 12 may be matched (e.g., the CTE of each component being within about 80% to 99% of each other). In another example, if thermal apparatus 20 comprises carbon-carbon and processing unit 10A comprises a silicon motherboard, then a recipe used to manufacture carbon-carbon may be matched to that of silicon. The matching of CTEs of components of processing module 40 may reduce testing costs and improve the long-term reliability of processing module 40. In some aspects, this may be beneficial for space systems, where regular cycles of heat and cold can reduce the reliability of bonded elements having differing CTEs. Having closely matched CTEs may provide exceptional bonding reliability and reduced testing costs.

In some aspects, manufacturing of thermal apparatus 20 may employ a slurry molding process that can produce high density preforms (e.g., a pre-fabricated structure of thermal apparatus 20) further densification with pitch melt impregnation. This process may be a low cost and faster method of manufacturing thermal apparatus 20 compared to more expensive manufacturing methods such as chemical vapor infiltrated (CVI) processing. In some examples, in-plane heat transport for the slurry molding process may provide thermal conductivity of about 205 W/m-C, and out-of-plane performance may provide thermal conductivity of about 44 W/m-C. In some aspects, in-plane heat transport for other techniques may provide thermal conductivity of about 350 W/m-C, and out-of-plane performance may provide thermal conductivity of about 40 W/m-C. In some aspects, using the slurry molding process, thermal apparatus 20 may be manufactured in about 8 days compared to about 6 months for CVI processing.

Figure 3B:
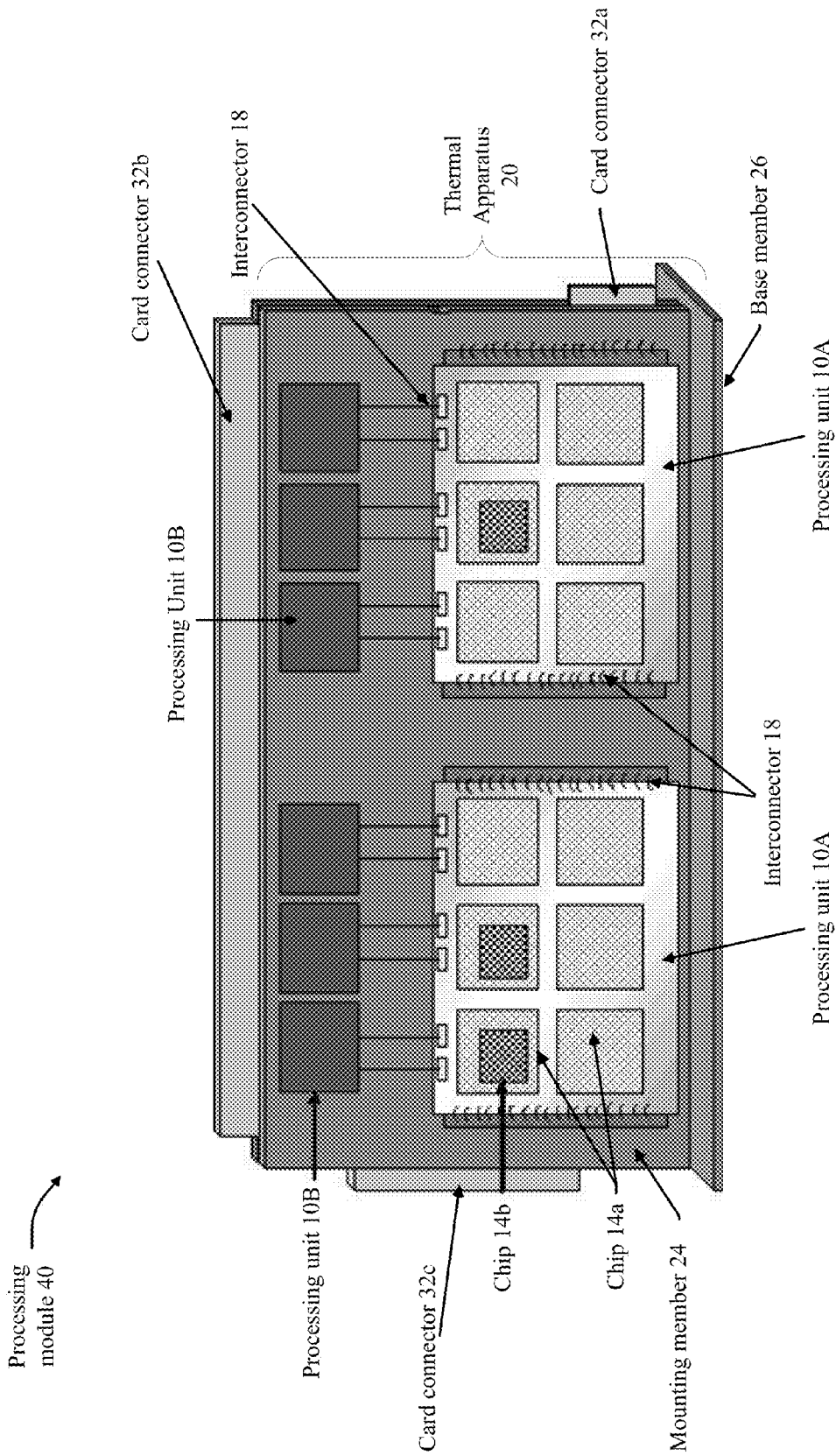

In some aspects, power conversion and distribution may become important design considerations once heat removal is dramatically improved. Power conversion and distribution may be especially important for systems utilizing large, instantaneous current draws, such as lasers. In another example, once the heat from a large number of chips 14 (e.g., silicon chips, ASICs, and/or FGPAs) is effectively dissipated by thermal apparatus 20, an important consideration may be the generation of sufficient power to accommodate the needs of those chips 14. Large current draws from chips 14 may create di/dt (e.g., change of current over time) issues when switching high current loads to processing cards. Thus, careful design may be needed to minimize di/dt effects or unwanted power losses. In some aspects, processing unit 10B may comprise point of load (POL)DC-DC converters and/or other power converters, which may be placed on thermal apparatus 20 for heat removal, but also near major power consumers on PWBs 30 for reduced line losses. Processing unit 10B may be mounted directly or indirectly onto mounting member 24. For example, mounting member 24 may be directly coupled to processing unit 10B and structurally support processing unit 10B (e.g., as shown in FIGS. 3B, 4B and 4C). In another example, processing unit 10B may be coupled to PWB 30, which may be mounted onto mounting member 24 (e.g., as shown in FIGS. 3A and 4D).

In some aspects, processing units 10B may comprise longer pins, which may be 7 millimeters (mm) in length. In some aspects, thermal apparatuses 20 primarily and structurally supporting processing units 10B (e.g., as shown in FIG. 4D) may have a reduced height compared to thermal apparatuses 20 structurally supporting more than just processing units 10B (e.g., thermal apparatuses 20 of FIGS. 3A, 3B, 4A, 4B and 4C). In some aspects, thermal apparatuses 20 primarily and structurally supporting processing units 10B may be referred to as Powerblades. In one example, thermal apparatus 20 may mount a processing unit 10B comprising a 100, 70, or 28 volt DC-DC power converter. In some aspects, processing units 10B may comprise power converters capable of generating from about 100 to 200 watts each.

In some aspects, the flat side (e.g., coupling side) of PWB 30 may be wet-bonded to mounting member 24. Wet-bonding PWB 30 to mounting member 24 with a thermally conductive bonding agent may provide a reasonable path for the heat generated by chips on PWB 30. In some aspects, thermal vias may also be used under problematic chips to increase heat flow. However, this may not be necessary because the hottest chips may be selectively coupled directly to mounting member 24 as part of processing units 10, in accordance with various aspects of the subject disclosure. If some chips are hot enough, copper flex braid may be bonded to the top of the chips to processing units 10. In some aspects, mounting member 24 may be coupled to processing unit 10 and/or PWB 30 using at least one of a bump bond, a thermal via, a screw, a copper flex braid, a thermally conductive bonding agent, a conductive epoxy, and adhesive. The conductive epoxy may comprise diamond filled epoxy. The bump bond may comprise an indium bump bond. The copper flex braid may be coupled to mounting member 24 through a non-coupling side of processing unit 10.

Figure 5:
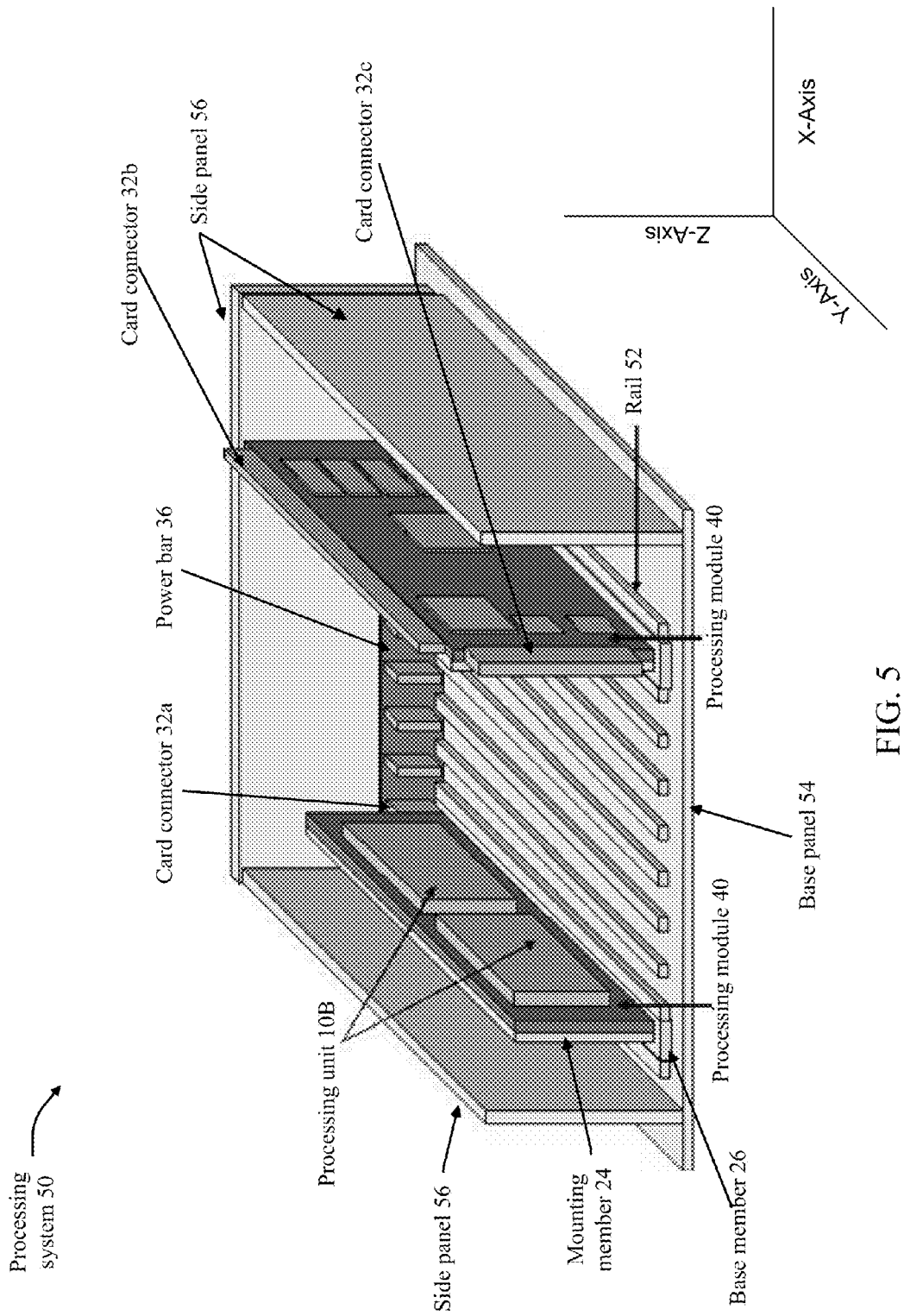
FIGS. 5-8 illustrate examples of processing systems, in accordance with various aspects of the subject disclosure.

FIGS. 5-8 illustrate examples of processing systems 50, in accordance with various aspects of the subject disclosure. Processing system 50 may comprise base panel 54, one or more processing modules 40 (e.g., processing modules 40 of FIGS. 3A, 3B, 4A, 4B, 4C and 4D), one or more side panels 56, one or more rails 52, power bar 36, and top panel 58. In some aspects, processing system 50 may be referred to as a box architecture, which may be used for holding, securing, and/or encasing processing modules 40. The one or more rails 52 may secure base member 26 of processing module 40 onto base panel 54 (e.g., as shown in FIG. 5). Base panel 54 may receive thermal energy from base member 26, which may receive thermal energy from mounting member 24, which may receive thermal energy from processing units 10 and/or PWBs 30.

Figure 7:
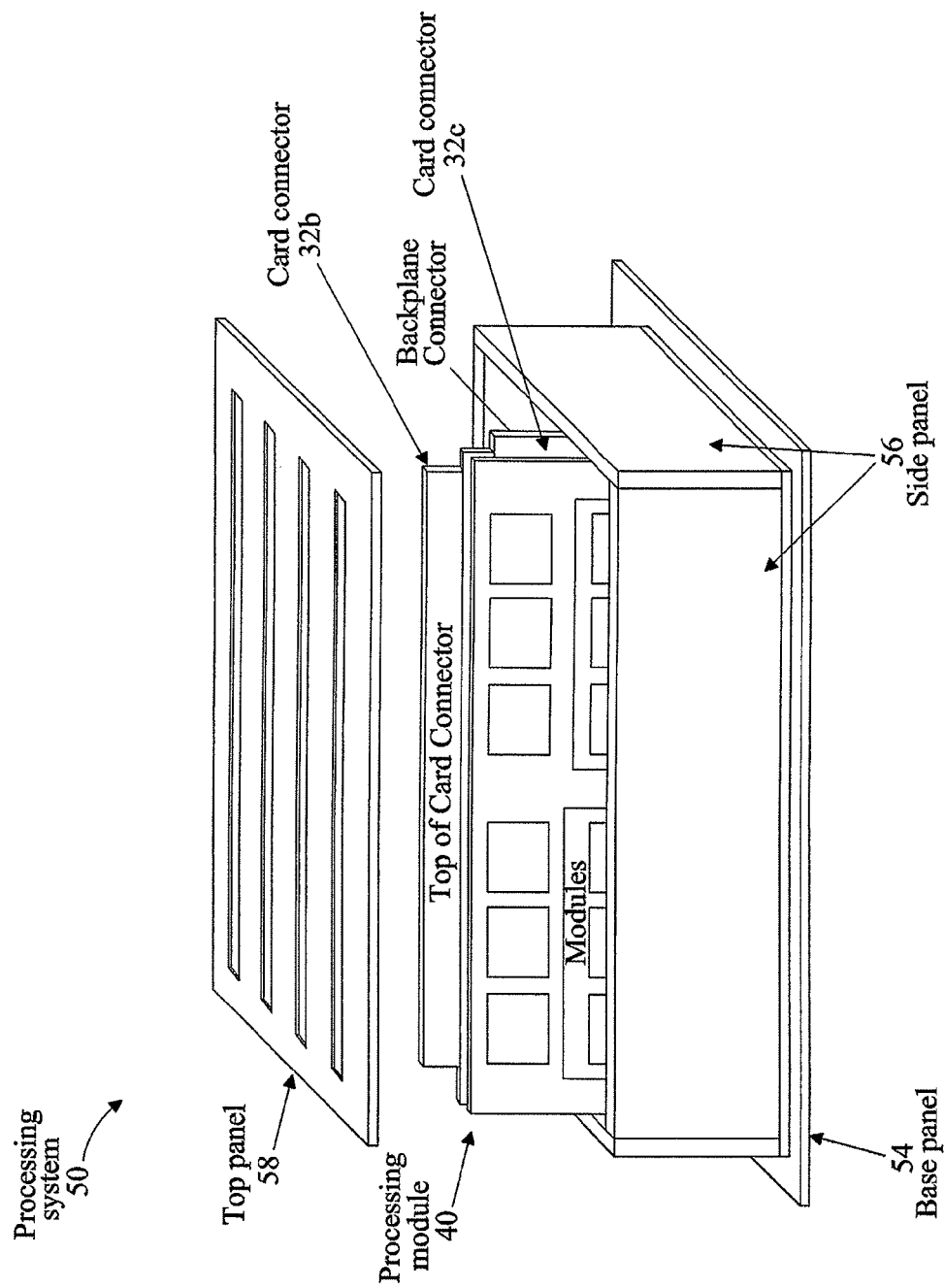
Figure 8:
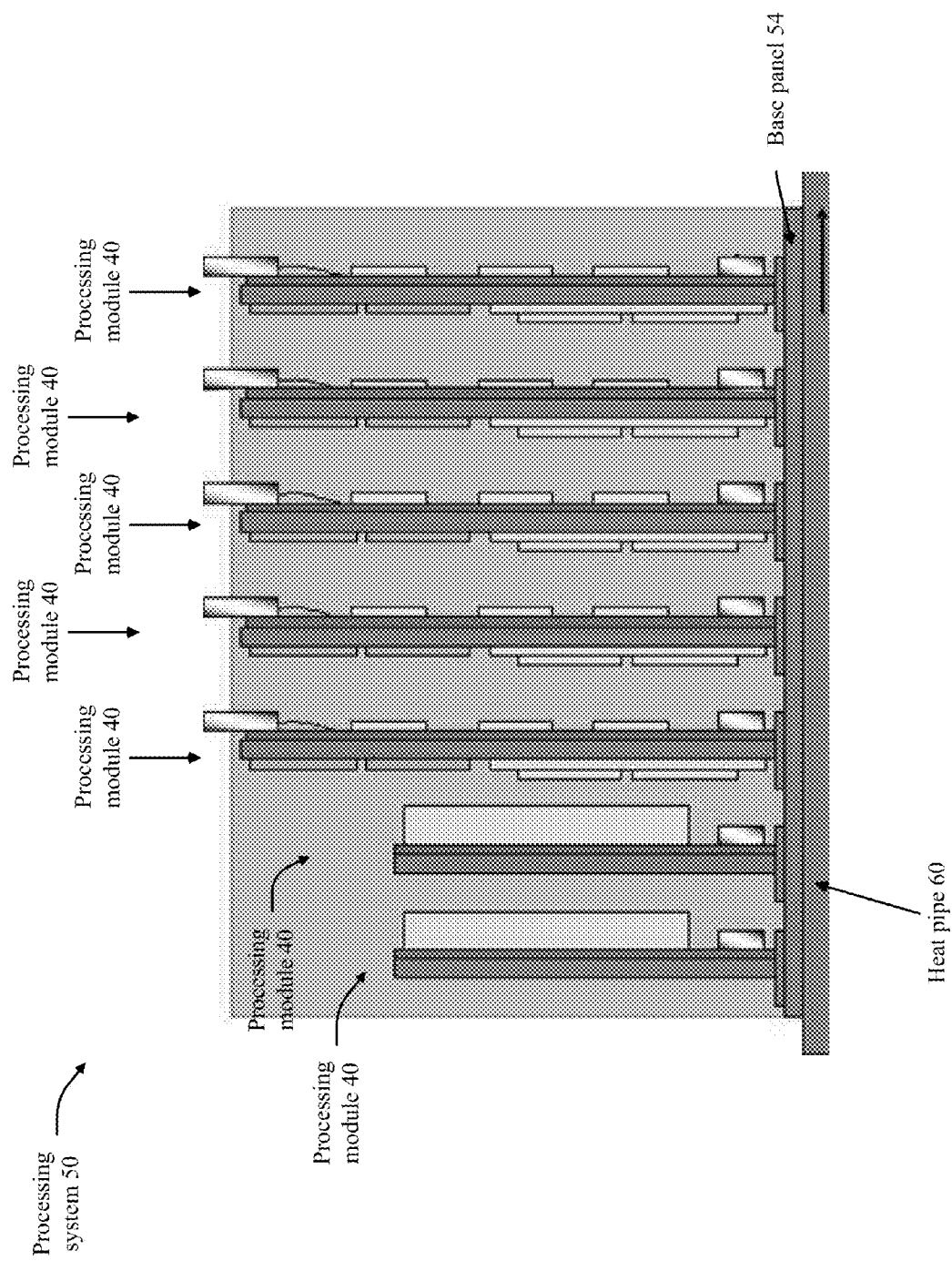

In some aspects, base panel 54 may be a heat spreader, comprising at least one of carbon-carbon, diamond, copper, aluminum, silicon and other suitable materials with high thermal conductivity, large stiffness, and low coefficient of thermal expansion (CTE) known to those of skill in the art. Base panel 54 may provide two-dimensional heat spreading, for example primarily in X and Y axes. In some aspects, and as shown in FIGS. 5 and 7, base panel 54 may have a larger cross sectional area than the area defined by the one or more side panels 56 (e.g., base panel 54 may comprise a heat spreader having a larger footprint than the box). Advanced heat pipes (e.g., heat pipe 60 attached to an outer surface of base panel 54 as shown in FIG. 8) may remove heat from base panel 54 to other areas. For example, heat pipe 60 may remove heat from base panel 54 into cold space if processing system 50 is used on a spacecraft. In contrast, other approaches involve using heat sinks placed on a non-coupling side of processing units 10 to remove heat from processing unit 10s. In some aspects, the CTE of each component of processing system 50 may be matched (e.g., the CTE of each component being within about 80% to 99% of each other). For example, processing units 10, PWB 30, mounting member 24, base member 26, base panel 54, side panel 56, rail 52, and top panel 58 may be matched.

In some aspects, the one or more side panels 56 may comprise at least one of carbon-carbon, diamond, copper, aluminum, silicon and other suitable materials with high thermal conductivity, large stiffness, and low coefficient of thermal expansion (CTE) known to those of skill in the art. In some aspects, one or more side panels 56 may be coated with at least one of silver and tantalum. The coating, for example, may be useful for radiation shielding. In some aspects, processing modules 40 may be secured as part of processing system 50 without using bolts and/or wedge locks on the one or more side panels 56 to secure processing modules 40. For example, mounting member 24 is not coupled to the one or more side panels 56 using a bolt and/or wedge lock.

In some aspects, processing modules 40 may be configured to be any size. The form factor for a processing module 40 may be selected by a system designer as needed. For example, processing module 40 may be a 9 U (366.7 mm) wide, 6 U (233.35 mm) high board. This may be typical for special communications, ladar, hyperspectral, or a 40 Gbps router with crypto engine. In some aspects, if a processing module 40 comprises primarily of processing units 10B (e.g., power converters), the processing module 40 may only be as high as needed in order to reduce mass. The same may be true for power bar 36. In another example, a designer may choose a 3 U or 6 U by 9 U configuration for a processing module 40 for a pipeline style processor for digital communications processing. This may enable a maximum number of chips 14, for example ASICs, to co-exist in two mated processing units 10A for maximum throughput at minimum power consumption and heat generation. Chips 14 consuming the most power may be located nearest the bottom of processing module 40 (e.g., closest to base panel 54). This may result in the shortest thermal path for the hottest chips 14, the shortest chip-to-chip communications path, and the maximum top-of-card connector real estate.

Figure 6:
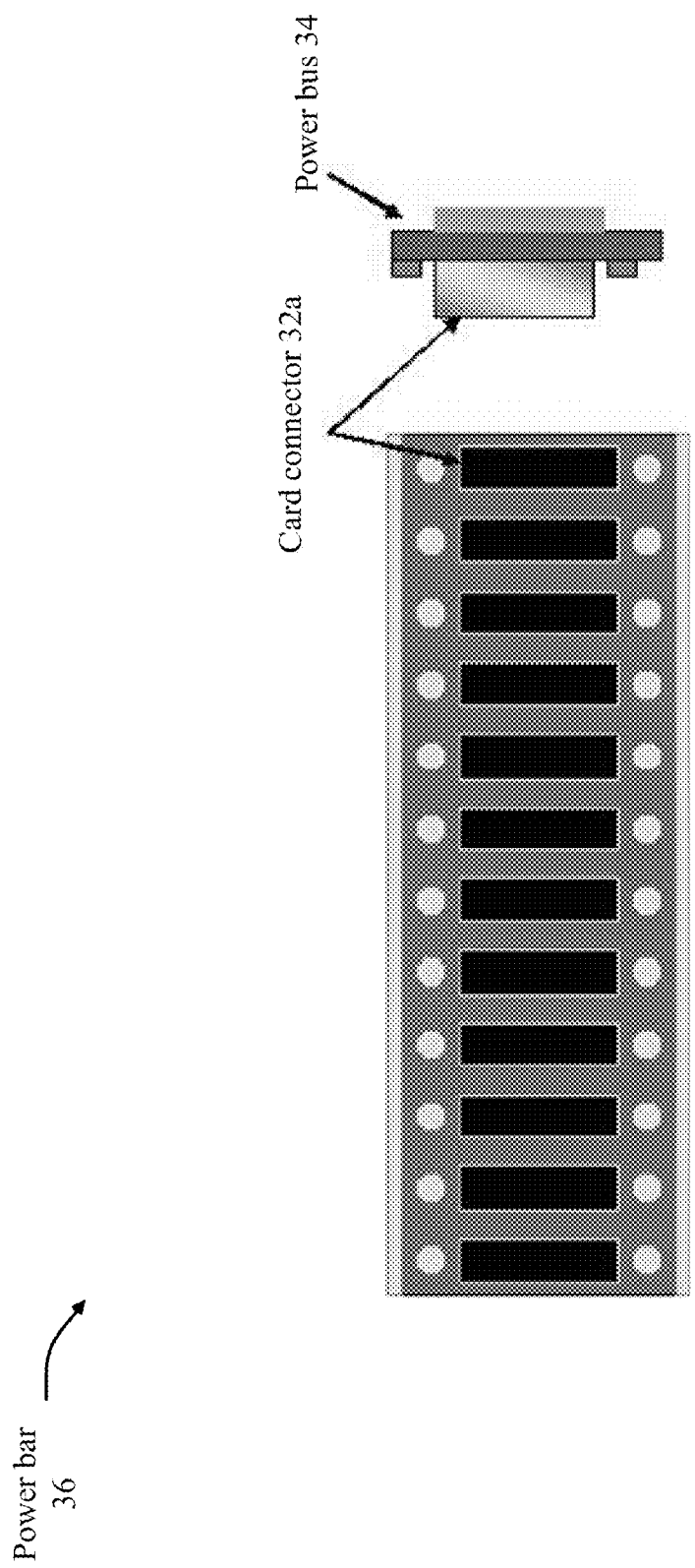

In some aspects, power bar 36 may distribute power among and/or to processing modules 40. Power bar 36 may be coupled to one or more side panels 56. Power bar 36 may comprise one or more card connectors 32*a* and a power bus 34 (e.g., as shown in FIG. 6). Power bus 34 may comprise copper or other suitable materials. The card connectors 32*a* of power bar 36 may comprise power connectors and may connect to the card connectors 32*a* of processing modules 40. For example, power bar 36 may utilize a power connector to connect to a power connector of processing module 40. In some aspects, power bar 36 may connect to a processing module 40 comprising primarily processing units 10B (e.g., power converters mounted on powerblades). Power bar 36 may distribute power from this powerblade to other processing modules that may need or use the power (e.g., a processing module 40 with processing units 10A). In one example, power bar 36 may route 5 volt power across power bus 34, which connects power from one processing module 40 (e.g., leftmost processing module 40 of FIG. 5) to another processing module 40 (e.g., rightmost processing module 40 of FIG. 5).

According to various aspects of the subject disclosure, a payload electronics architect may optimize parameters such as card form factor or partitioning of chips between processing units 10A and PWB 30 to create an optimal architecture of processing system 50. In some aspects, processing system 50 may comprise up to ten processing modules 40. In some aspects, processing system 50 may comprise more than ten processing modules 40. Each processing module 40 may generate up to 200 watts per processing module 40. In some approaches, power converter cards may be limited to approximately 50 watts per card, and as a result, extra companion power converter cards may be needed for each processing unit, adding more heat to the system. According to various aspects of the subject disclosure, processing system 50 may increase the power generating capacity of its components through efficient heat dissipation, thus allowing for more processing modules 40 to be utilized. In some approaches, heat may be transported from heavy power consuming electronic devices via heavy aluminum thermal bridges to heat pipes.

According to some approaches, a maximum power a ten card box can currently dissipate in a space application may be about 250 watts. Aspects of the subject disclosure provide a processing system 50 that can dissipate power about ten times greater. For example, processing system 50 may dissipate greater than about 1000 watts.

Certain aspects of the subject disclosure may remove current barriers to Moore's Law throughput increases caused by the inability to efficiently remove heat from compact digital electronics. In some aspects, more heat can be removed from electronics than has ever been possible before, without complicated liquid cooling systems that may be a undesirable for maintenance in aero systems and impractical in space systems. In some aspects, less heat may be generated per application than traditional approaches. In some aspects, processing systems 50 may be far more effective at removing the heat generated by dense electronics than other approaches. In some aspects, extremely compact processing systems 50 may be built that can efficiently remove heat. This may be ideal for space, missile, munitions and aero systems. For example, a spacecraft may comprise processing system 50.

In some aspects, processing systems 50 may result in about a 10-fold improvement over current approaches in the ability to remove heat from a digital electronics boxes in space. For size, weight and power (SWAP) constrained vehicles, the inclusion of denser, more capable processors provides additional degrees of design freedom when designing systems to fulfill critical mission needs. Processing systems 50 may be made smaller, less expensively, have increased functional capabilities, or embody a combination of these traits.

Various aspects of the subject disclosure have applications in dense digital electronics for aerospace systems, especially defense applications such as precision guided munitions, air-to-air, air-to-ground missiles and missile defense missiles including multiple kill vehicles (MKV) and terminal high altitude area defense (THAAD); high altitude aero systems such as unmanned aerial vehicles (UAVs) and fighters such as the F-35 and F-22, where convective cooling is ineffective; mission processors and sensor systems; and space systems, owing to the challenges associated with rejecting heat from dense digital processing subsystems. Another use may be in small bore circular applications for precision guided munitions (PMGs) or missiles. In these cases, circular silicon wafers from commercial silicon foundries with diameters up to 9 inches may be used, which may be ideal for PGM or tactical missiles, where radiation effects are not a consideration.

According to various aspects of the subject disclosure, the subject technology may be related to cooling, thermal management, advanced packaging, and silicon-on-silicon motherboards. In some aspects, the thermal energy being transferred, as described herein, may be by conduction and/or radiation.

The foregoing description is provided to enable a person skilled in the art to practice the various configurations described herein. While the present invention has been particularly described with reference to the various figures and configurations, it should be understood that these are for illustration purposes only and should not be taken as limiting the scope of the invention.

There may be many other ways to implement the invention. Various functions and elements described herein may be partitioned differently from those shown without departing from the sprit and scope of the invention. Various modifications to these configurations will be readily apparent to those skilled in the art, and generic principles defined herein may be applied to other configurations. Thus, many changes and modifications may be made to the invention, by one having ordinary skill in the art, without departing from the scope of the invention.

Terms such as "top," "bottom," "front," "rear," "proximal," "distal" and the like as used in this disclosure should be understood as referring to an arbitrary frame of reference, rather than to the ordinary gravitational frame of reference. Thus, a top surface, a bottom surface, a front surface, and a rear surface may extend upwardly, downwardly, diagonally, or horizontally in a gravitational frame of reference.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such an embodiment may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such a configuration may refer to one or more configurations and vice versa.

The word "exemplary" is used herein to mean "serving as an example or illustration." Any aspect or design described herein as "exemplary" is not necessarily to be construed as preferred or advantageous over other aspects or designs.

A reference to an element in the singular is not intended to mean "one and only one" unless specifically stated, but rather "one or more." The term "some" refers to one or more. All structural and functional equivalents to the elements of the various configurations described throughout this disclosure that are known or later come to be known to those of ordinary skill in the art are expressly incorporated herein by reference and intended to be encompassed by the invention. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A processing module comprising:
   a mounting member configured to structurally support a first processing unit and receive thermal energy from the first processing unit through a coupling side of the first processing unit by conduction; and
   a base member coupled to the mounting member and configured to receive thermal energy from the mounting member, wherein a thermal conductivity of at least one of the mounting member and the base member is greater than 50 Watts/meter Celsius (W/m-C), and wherein coefficients of thermal expansion (CTEs) of the mounting member, the base member, and the coupling side of the first processing unit are matched.

2. The processing module of claim 1, wherein at least one of the mounting member and the'base member comprises at least one of carbon-carbon and diamond, wherein a Young's modulus of at least one of the mounting member and the base member is greater than 75 Giga-Pascal, wherein the mounting member and the base member are integrally formed, and wherein the base member is orthogonally coupled to the mounting member.

3. The processing module of claim 1, wherein the mounting member comprises a first side and a second side, wherein the first side is coupled to the first processing unit and the second side is coupled to a second processing unit, and wherein the mounting member is further configured to structurally support the second processing unit and receive thermal energy from the second processing unit through a coupling side of the second processing unit by conduction.

4. The processing module of claim 1, wherein the first processing unit is coupled to the mounting member using at least one of a bump bond, a thermal via, a copper flex braid, a thermally conductive bonding agent, a conductive epoxy, and adhesive.

5. The processing module of claim 1, wherein the coupling side of the first processing unit is coated with a coating having a thermal conductivity greater than 300 Watts/meter Celsius (W/m-C).

6. The processing module of claim 5, wherein the coating comprises at least one of carbon-carbon and diamond.

7. The processing module of claim 1, wherein the first processing unit comprises:

a substrate comprising a proximal side and a distal side, wherein the coupling side of the first processing unit comprises the proximal side of the substrate;

a first chip comprising a proximal side and a distal side, wherein the proximal side of the first chip is coupled to the distal side of the substrate using a first connector, wherein the first connector is configured to provide at least one of an electrical connection and a thermal conduit between the substrate and the first chip, wherein the first connector is positioned substantially in an inner portion of the first chip; and a second chip comprising a proximal side and a distal side, wherein the proximal side of the second chip is coupled to the distal side of the first chip using a second connector, wherein the second connector is configured to provide at least one of an electrical connection and a thermal conduit between the first chip and the second chip, wherein the second connector is positioned substantially in an inner portion of the second chip.

8. The processing module of claim 1, wherein the first processing unit comprises a power converter.

9. The processing module of claim 1, wherein the mounting member is further configured to structurally support a printed wiring board, the printed wiring board coupled to the first processing unit using one or more interconnectors, the printed wiring board comprising one or more card connectors, the one or more interconnectors comprising wire bonds, the one or more card connectors comprising power connectors.

10. A processing apparatus comprising:

a substrate comprising a proximal side and a distal side, the proximal side coated with a coating having a thermal conductivity greater than 300 Watts/meter Celsius (W/m-C);

a first chip comprising a proximal side and a distal side, wherein the proximal side of the first chip is coupled to the distal side of the substrate using a first connector, wherein the first connector is configured to provide at least one of an electrical connection and a thermal conduit between the substrate and the first chip, wherein the first connector is positioned substantially in an inner portion of the first chip;

a second chip comprising a proximal side and a distal side, wherein the proximal side of the second chip is coupled to the distal side of the first chip using a second connector, wherein the second connector is configured to provide at least one of an electrical connection and a thermal conduit between the first chip and the second chip, wherein the second connector is positioned substantially in an inner portion of the second chip; and a mounting member configured to structurally support the substrate and to receive thermal energy from the substrate through the proximal side of the substrate by conduction, wherein coefficients of thermal expansion (CTEs) of the substrate, the first chip, the second chip, and the mounting member are matched.

11. The processing apparatus of claim 10, wherein the substrate comprises at least one of silicon, gallium arsenide, gallium sulfide, gallium phosphide, gallium nitride, and alumina oxide, and wherein the coating comprises carbon-carbon.

12. The processing apparatus of claim 10, wherein the coating comprises diamond.

13. The processing apparatus of claim 10, wherein the substrate comprises a printed wiring board and one or more passive components, the one or more passive components being embedded in the printed wiring board, the one or more passive components comprising at least one of a resistor, a capacitor, and a diode, and wherein the substrate is configured to provide electronic connectivity among the first chip and the second chip.

14. The processing apparatus of claim 10, wherein the first chip comprises at least one of an application-specific integrated circuit (ASIC), a field-programmable gate array (FPGA), and memory, and wherein the second chip comprises at least one of an ASIC, a FPGA, and memory.

15. The processing apparatus of claim 10, wherein the first connector comprises at least one of a bump bond, a thermal via, a copper flex braid, a thermally conductive bonding agent, a conductive epoxy, and adhesive, and wherein the second connector comprises at least one of a bump bond, a thermal via, a copper flex braid, a thermally conductive bonding agent, a conductive epoxy, and adhesive.

16. The processing apparatus of claim 15, wherein the conductive epoxy comprises diamond filled epoxy, and wherein the bump bond comprises an indium bump bond.

17. A processing system comprising:
a base panel; and
a processing module coupled to the base panel, the processing module comprising:
a mounting member configured to structurally support a first processing unit and receive thermal energy from the first processing unit through a coupling side of the first processing unit by conduction; and a base member coupled to the mounting member and the base panel, the base member configured to receive thermal energy from the mounting member, wherein a thermal conductivity of at least one of the mounting member and the base member is greater than 50 Watts/meter Celsius (W/m-C), wherein the base panel is configured to receive thermal energy from the base member, and wherein coefficients of thermal expansion (CTEs) of the coupling side of the first processing unit, the mounting member, the base member, and the base panel are matched.

18. The processing system of claim 17, further comprising:

one or more rails configured to secure the base member onto the base panel;

one or more side panels comprising at least one of carbon-carbon, diamond, copper, aluminum, and silicon, wherein at least one of the one or more side panels is coated with at least one of silver and tantalum, wherein the mounting member is not coupled to the one or more side panels using a bolt or a wedge lock; and a power bar coupled to at least one of the one or more side panels, the power bar configured to distribute power to a processing module, the power bar comprising one or more power bar power connectors, each power bar power connector configured to connect to a processing module power connector, wherein the base panel comprises a heat spreader, the heat spreader comprising at least one of carbon-carbon and diamond.

19. A spacecraft comprising the processing system of claim 17.

* * * * *